United States Patent [19]

Chen et al.

[11] Patent Number: 5,373,465
[45] Date of Patent: Dec. 13, 1994

[54] NON-VOLATILE SEMICONDUCTOR MEMORY CELL

[75] Inventors: Ling Chen, Sunnyvale; Tien-ler Lin, Cupertino; Albert Wu, San Jose, all of Calif.

[73] Assignee: Integrated Silicon Solution, Inc., Sunnyvale, Calif.

[21] Appl. No.: 132,942

[22] Filed: Oct. 7, 1993

Related U.S. Application Data

[62] Division of Ser. No. 764,019, Sep. 23, 1991, Pat. No. 5,317,179.

[51] Int. Cl.$^5$ .................... G11C 11/34; G11C 7/00
[52] U.S. Cl. .................... 365/185; 365/218; 257/321; 257/316
[58] Field of Search .............. 365/185, 218; 257/316, 257/321, 322

[56] References Cited

U.S. PATENT DOCUMENTS

| | | | |
|---|---|---|---|
| 4,328,565 | 5/1982 | Harari . | |
| 4,412,311 | 10/1983 | Miccoli et al. . | |
| 4,688,078 | 8/1987 | Hseih . | |
| 4,698,787 | 10/1987 | Mukherjee et al. . | |
| 4,783,766 | 11/1988 | Samachisa et al. . | |
| 4,794,565 | 12/1988 | Wu et al. . | |
| 4,804,637 | 2/1989 | Smayling et al. | 437/52 |
| 4,806,201 | 2/1989 | Mitchell et al. | 437/43 |
| 4,861,730 | 8/1989 | Hsia et al. | 437/43 |
| 4,894,802 | 1/1990 | Hsia et al. . | |
| 4,957,877 | 9/1990 | Tam et al. | 437/43 |
| 5,084,745 | 1/1992 | Iizuka | 365/185 |
| 5,111,430 | 5/1992 | Morie | 365/185 |
| 5,200,919 | 4/1993 | Kaya | 365/185 |
| 5,202,850 | 4/1993 | Jenq | 365/185 |
| 5,216,268 | 6/1993 | Chen et al. | 365/185 |
| 5,242,848 | 9/1993 | Yeh | 437/43 |

*Primary Examiner*—Eugene R. LaRoche
*Assistant Examiner*—Son Dinh
*Attorney, Agent, or Firm*—Skjerven, Morrill, MacPherson, Franklin & Friel

[57] ABSTRACT

Disclosed is a flash EEPROM cell needing only a 5 volt external source using an on-chip voltage multiplier circuit to provide high voltages necessary to effect Fowler-Nordheim tunneling during both the program and erase modes. Properties of dielectric layers between a floating gate and a control gate and between the floating gate and a drain region differ to facilitate programming and erasing of the floating gate. Also disclosed is a method for producing a flash EEPROM cell by forming the insulative layer between a floating gate and a control gate to have a capacitance lower than the capacitance of the insulating layer between the floating gate and a drain region.

3 Claims, 4 Drawing Sheets

NON-VOLATILE SEMICONDUCTOR MEMORY CELL

This application is a division of application Ser. No. 07/764,019, filed Sep. 23, 1991 now U.S. Pat. No. 5,317,179.

BACKGROUND OF THE INVENTION

1. Field of the Invention

This invention relates to electrically erasable programmable read-only memory (EEPROM) cells, and more particularly to a split gate transistor and common gate flash EEPROM cell.

2. Description of the Prior Art

With conventional split gate flash EEPROM cells a disadvantage exists in that, in addition to a standard 5 volt power supply used to read the cell, a secondary power supply of 12 volts is required to program the cell. In a conventional prior art cell, a floating gate is charged with electrons by channel hot-electron programming and the floating gate is discharged by Fowler-Nordheim tunneling of electrons from the floating gate to a drain region.

A typical prior art split gate flash EEPROM cell has been described in U.S. Pat. No. 4,783,766 issued Nov. 8, 1988, to G. Samachisa et al.

FIGS. 1 and 2 illustrate in simplified and greatly enlarged fashion first and second embodiments of a typical prior art split gate EEPROM cell such as that described in the above-referenced patent. FIG. 1 shows a cross section through a prior art EEPROM memory cell comprising various layers grown and/or deposited on P-type monocrystalline silicon substrate 1. Upon substrate 1 is grown a first gate oxide 4 having a thin dielectric portion 5. Thin dielectric portion 5 is typically formed using the well-known Kooi effect. A first polysilicon layer, which is lightly doped, is applied upon first gate oxide 4 and thin dielectric region 5, and thereafter masked and etched to define floating gate 6. Interpoly oxide 7 and second gate oxide 8 are then grown in a manner well known in the art. A second polysilicon layer is deposited over interpoly oxide 7 and second gate oxide 8, then doped, masked and etched to form control gate 9. Finally, substrate 1 is doped forming self-aligned source region 2 and drain region 3, having a small side diffusion located under one edge of control gate 9 and one edge of floating gate 6, respectively. Disposed below first gate oxide 4 and thin dielectric region 5 is first channel region 10. Below second gate oxide 8 and control gate 9 is second channel region 11 which abuts source region 2, but does not extend below floating gate 6.

FIG. 2 shows a second embodiment of the prior art EEPROM cell in which first gate oxide 4' is grown to a uniform thickness.

To erase the prior art EEPROM cells illustrated in FIGS. 1 and 2, a potential of approximately 17 to 20 volts is applied to the drain region 3, control gate 9 is grounded, and source region 2 is either grounded or allowed to float. Under these conditions electrons will tunnel from floating gate 6 through thin dielectric portion 5 into drain region 3 by-virtue of the well-known Fowler-Nordheim tunneling effect. As a result, floating gate 6 achieves a positive potential. In erasing an EEPROM cell of FIG. 2, tunneling through first oxide 4' is obtained if the uniform thickness of first oxide 4' is limited to approximately 200 Å or below.

In programming the prior art EEPROM cells of FIGS. 1 and 2, a potential of approximately 17 to 20 volts is applied to the control gate 9, drain region 3 is held at approximately 10 volts, and source region 2 is grounded. Under these conditions, electrons enter and are trapped by floating gate 6 by the channel hot electron injection phenomenon. As a result, floating gate 6 achieves a negative potential.

During a read operation, a potential of 5 volts is applied to control gate 9 and a potential of 2 volts is applied to drain region 3. If a net positive charge exists on floating gate 6 (i.e., an erase mode has been performed), then the channel region 10 will be open to current flow from drain region 3 to source region 2. Likewise, the 5-volt potential on control gate 9 will open channel region 11 to current flow from drain region 3 to source region 2. Therefore, if a net positive charge exists on floating gate 6, current will flow across channels 10 and 11 from drain region 3 to source region 2. If a net negative charge resides on floating gate 6, current from drain region 3 will be blocked from passing to source region 2 because channel region 10 will be nonconductive.

A disadvantage with the above-described prior art EEPROM cell is that in addition to a standard 5 volt power supply necessary to perform a read function, a second power supply of 12 volts or more is required to perform the programming function described above.

SUMMARY OF THE INVENTION

It is an object of the invention to provide a non-volatile memory cell which can operate using only a 5 volt source.

In accordance with the present invention, a non-volatile memory cell is provided comprising a substrate, a doped region disposed in a first portion of the substrate, a charge storing body having a first end adjacent the doped region and a second end disposed adjacent a second portion of the substrate, first dielectric layer disposed between the substrate and the charge storing body having a first region disposed between the doped region and the charge storing body and having a second region disposed between the second portion of the substrate and the charge storing body, a conductive body disposed adjacent the charge storing body, and a second dielectric layer disposed between the conductive body and the charge storing body, wherein the second dielectric layer defines a first capacitance, the first region of the first dielectric layer defines a second capacitance, the first region of the first dielectric layer defines a third capacitance, the second capacitance being much greater than the first capacitance and the second capacitance being greater than the third capacitance.

Further, in accordance with the present invention, a split gate EEPROM device is provided which uses Fowler-Nordheim tunneling for both erase and program functions. For both functions, the tunneling electrons travel through a dielectric layer separating a floating gate and a control gate. The use of Fowler-Nordheim tunneling makes it possible to operate the memory cells using only a standard 5 volt power supply. High on-chip voltages used in the Fowler-Nordheim tunneling process are generated from the 5 volt source by using a voltage multiplier circuit formed on the memory chip housing the memory cells.

Further, in accordance with the present invention, a method for programming and erasing the memory cell is disclosed, which process comprises forming a dielectric layer between a floating gate and a control gate such that the dielectric has good insulation properties for charge storage, and has a low permittivity so that a high electric field can be generated to induce Fowler-Nordheim tunneling during programming and erasing.

Further, in accordance with the present invention a process for producing the memory cell is disclosed, which process comprises forming a second region in the body of semiconductor material; forming a floating gate over a portion of the lightly doped region and a portion of the undoped semiconductor material; forming a second dielectric layer over the floating gate; and forming a control gate over the second dielectric layer above the floating gate.

DETAILED DESCRIPTION OF THE PREFERRED EMBODIMENT

A presently preferred embodiment of the present invention is disclosed. It will be understood by one skilled in the art that other embodiments of the present invention are also possible and are included within the scope of the appended claims.

Figure 1:
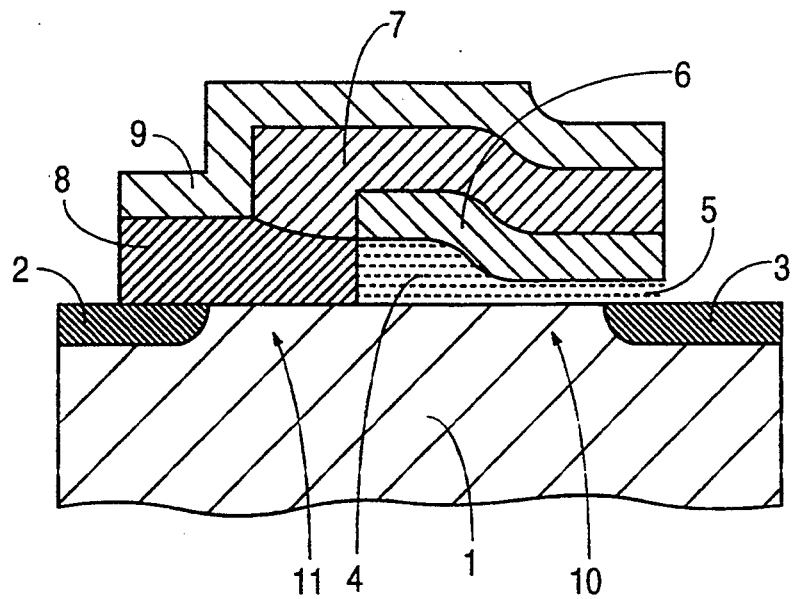
FIG. 1 shows a cross-section of a prior art EEPROM cell according to a first embodiment.
Figure 2:
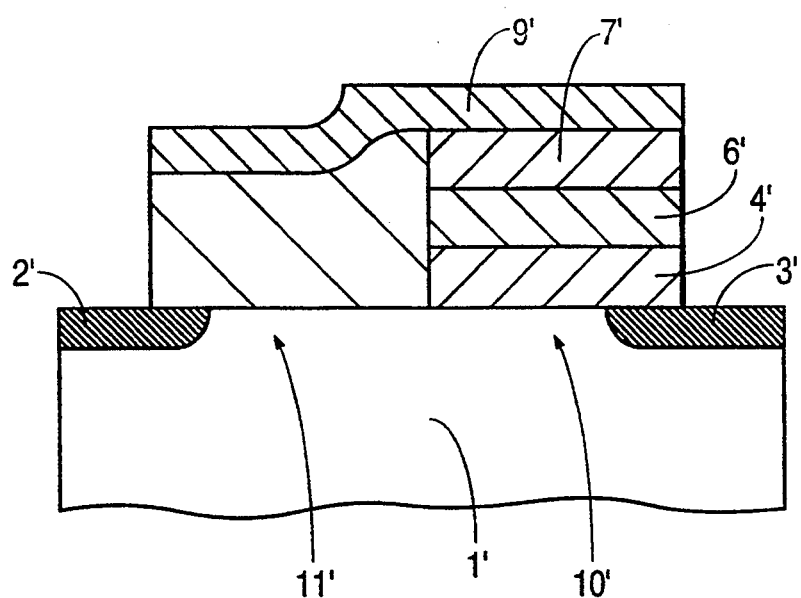
FIG. 2 shows a cross-section of a prior art EEPROM cell according to a second embodiment.
Figure 3:
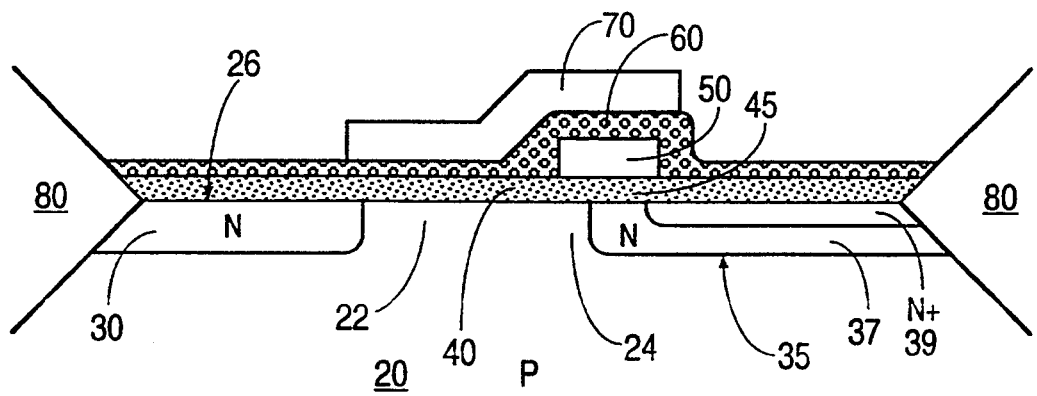
FIG. 3 shows a cross-section of the EEPROM cell in accordance with the present invention.

Referring to FIG. 3, a memory cell of the present invention will be described. Upon a P-type monocrystalline silicon substrate 20 is disposed a field oxide region 80 as is known in the art. Source region 30 and drain region 35 are doped regions of the substrate 20. Drain region 35 is comprised of a heavily doped portion 39 and a lightly doped portion 37. First channel region 22 and second channel region 24 are disposed in the substrate 20, adjacent the source region 30 and drain region 35, respectively. Upon the surface 26 of the substrate 20 is a first dielectric layer 40 having a dielectric portion 45 located above the drain region 35. First dielectric layer 40 is preferably tantalum oxide, but may be, for example, silicon dioxide or silicon nitride. Disposed above the second channel region 24 and dielectric portion 45 is floating gate (charge storing body) 50. Above and to one side of floating gate 50 is disposed a second dielectric layer 60 which is preferably silicon dioxide. Polycrystalline silicon control gate (conductive body) 70 is positioned on second dielectric layer 60, control gate 70 including a portion located over the first channel region 22 and a further portion which extends above floating gate 50 and partially above source region 30.

The type of drain structure depicted in FIG. 3 is known as a double-diffused drain (DDD). Lightly doped portion 37 is disposed adjacent the surface 26 of the substrate 20, and one end of the lightly doped portion 37 is disposed under one end of a polycrystalline silicon floating gate 50. Heavily doped portion 39 is disposed within the lightly doped portion 37. Although the DDD structure described above is preferred, it is recognized that a lightly-doped drain (LDD) structure may be incorporated, as is known in the art.

To operate the cell using only a 5 volt power source and to prevent an "over-erase" problem, the device uses a voltage multiplier and Fowler-Nordheim tunneling for both program and erase functions. In addition, the split gate structure of the memory cell aids in preventing "over-erase" by controlling the conductivity of the first channel region 22.

Figure 4:
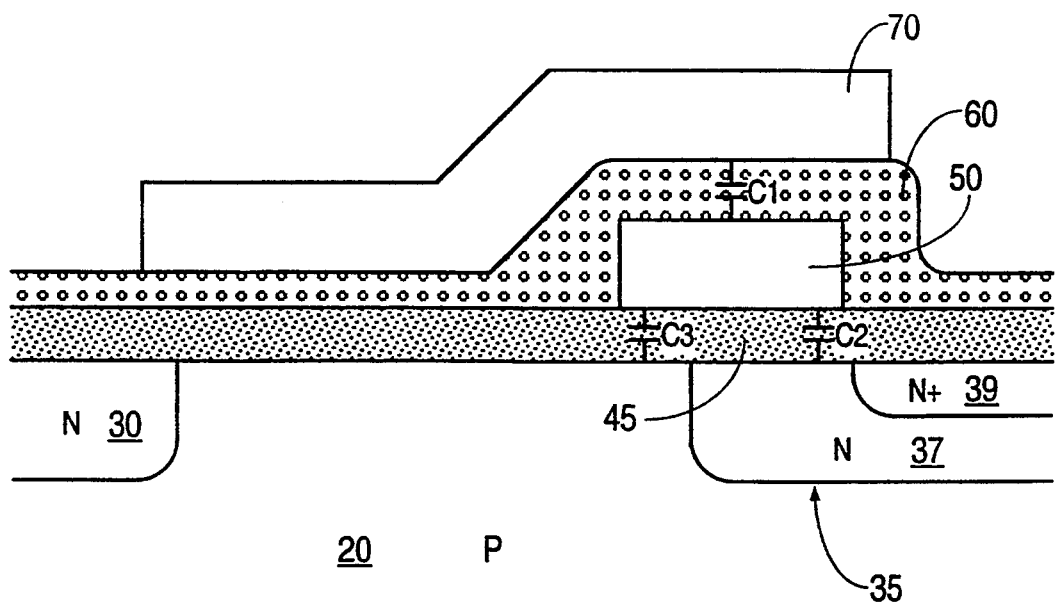
FIG. 4 shows a combination cross-section and equivalent circuit representation of the inventive EEPROM cell indicating the location of equivalent capacitive elements in the cell.

As an aid to understanding the means for making the memory cell of this invention, attention is directed to FIG. 4. FIG. 4 shows in simplified fashion the memory cell, and in particular the drain region 35, floating gate 50 and control gate 70. The capacitive effect between the floating gate 50 and the control gate 70, which is caused by second dielectric layer 60, is indicated as C1 in FIG. 4. The capacitive effect between the floating gate 50 and the drain region 35, which is caused by dielectric portion 45, is indicated in FIG. 4 as C2. The capacitive effect between floating gate 50 and substrate 20, also caused by dielectric portion 45, is indicated as C3 in FIG. 4.

During an erase function, to achieve Fowler-Nordheim tunneling of electrons from the floating gate 50 to the control gate 70, it is required that the capacitive effect C1 be much smaller than the sum of capacitive effects C2 and C3, or $$C2 + C3 >> C1 \tag{Eq. 1}$$

If this is achieved, then electrons will flow from the floating gate 50 into the control gate 70 at a higher rate than electrons flow out of drain region 35 and the substrate 20 into floating gate 50. Because the flow of electrons out of floating gate 50 is greater than the flow of electrons into floating gate 50, floating gate 50 achieves a net positive charge.

During a program function, to achieve Fowler-Nordheim tunneling of electrons from the control gate 70 to the floating gate 50, a high voltage from the voltage multiplier (not shown) is applied to the drain region 35. According to this invention, it is required that the capacitive effect C2 between the floating gate 50 and drain region 35 be much greater than the sum of the capacitive effect C1, between the control gate 70 and floating gate 50, and C3, between the floating gate 50 and substrate 20, or $$C2 >> C1 + C3 \tag{Eq. 2}$$

Under these conditions, electrons will flow by Fowler-Nordheim tunneling from control gate 70 into floating gate 50 causing the floating gate 50 to achieve a net negative charge.

Combining the desired capacitive effects described above in Eq. 1 and Eq. 2 with respect to programming and erasing the floating gate 50, it becomes apparent that C2 must be both much greater than C1 and much greater than C3 for the device design to work.

Note that the tunneling current flow is actually through the second dielectric layer 60 for both erase and program functions. Therefore, the second dielectric layer 60 must be characterized in that a) it exhibits a smaller dielectric permittivity than the first dielectric layer 40, so that the electric field in the second dielectric layer 60 will be much higher than the electric field in the first dielectric layer 40; b) the second dielectric layer 60 must have good dielectric integrity to provide good product yield; and c) the second dielectric layer 60 must exhibit low charge trapping to provide adequate device reliability.

The operation of the cell will now be described. During an erase function, a voltage multiplier (not shown) is used to convert a 5 volt DC source to a high voltage of 20 to 30 volts DC which is applied to the control gate 70. Both the source region 30 and the drain region 35 are grounded. Under these conditions, the electrons trapped in the floating gate 50 are attracted to the high voltage potential on the control gate 70. Because the capacitive effect between the floating gate 50 and the control gate 70 is less than the sum of the capacitive effects between the floating gate 50 and the drain region 35 and second channel region 24, the electrons pass through the second dielectric layer 60 into the control gate 70 by means of Fowler-Nordheim tunneling.

During a program function, the high voltage generated by the voltage multiplier (not shown) is applied to the drain region 35. In addition, the control gate 70 is grounded and the source region 30 is allowed to float. Under these conditions, the sum of the capacitive effects between the floating gate 50 and the control gate 70 plus the capacitive effect between the floating gate 50 and the substrate 20 is much smaller than the capacitive effect between the floating gate 50 and the drain region 35. This results in Fowler-Nordheim tunneling of electrons from the control gate 70 into the floating gate 50, thereby causing the floating gate 50 to acquire a negative charge.

During a read function, the 5 volt source is coupled to the control gate 70 and a 2 volt potential is connected to the drain region 35. The 5 volt potential applied to the control gate 70 biases first channel region 22, allowing current to flow. If floating gate 50 has a positive potential (i.e., if an erase function has been performed), then floating gate 50 will bias second channel region 24 and allow electron current to flow from source region 30 to drain region 35. On the other hand, if floating gate 50 has a negative potential, (i.e., a programming function has been performed), then second channel region 24 will be biased to block current flow from source region 30 to drain region 35, despite the state of the control gate 70. When reading the memory cell, the detection of current flow between source region 30 and drain region 35 due to the positive potential on floating gate 50 may be interpreted as either a binary "1" or "0" depending on the convention selected by the manufacturer of devices using the memory cells.

Figure 5A:
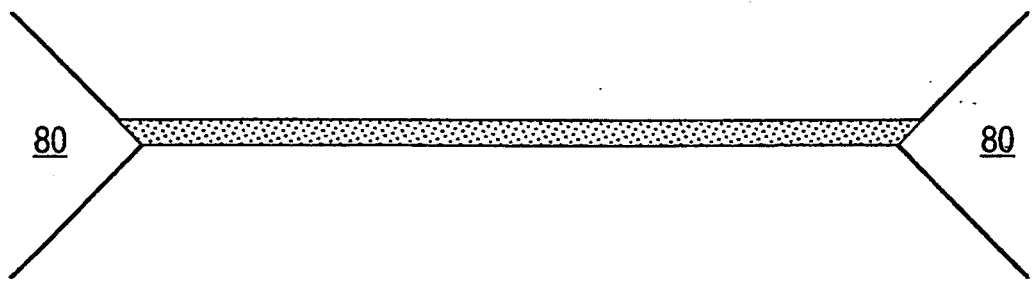
FIGS. 5A–5E show the various stages of the preferred process for producing the memory cell of the present invention.

The procedure for producing the memory cell described above will now be explained. Referring to FIG. 5A, upon a monocrystalline silicon substrate 20, having been doped with boron to a doping concentration at about $10^{16}$ atoms/cm$^3$, thereby producing a resistivity of about 1 to 10 $\Omega$-cm, is grown a field oxide layer 80 to a thickness of 7000 Å in the manner known in the art. Upon the surface 26 of the substrate 20 is then formed a first dielectric layer 40, most preferably tantalum oxide, but may also be $SiO_2$ or $Si_3N_4$. The first dielectric layer 40 is grown to a depth of 100–1000 Å, preferably 800 Å using methods known in the art such as chemical vapor deposition, reactive sputtering or thermal reaction.

Figure 5B:
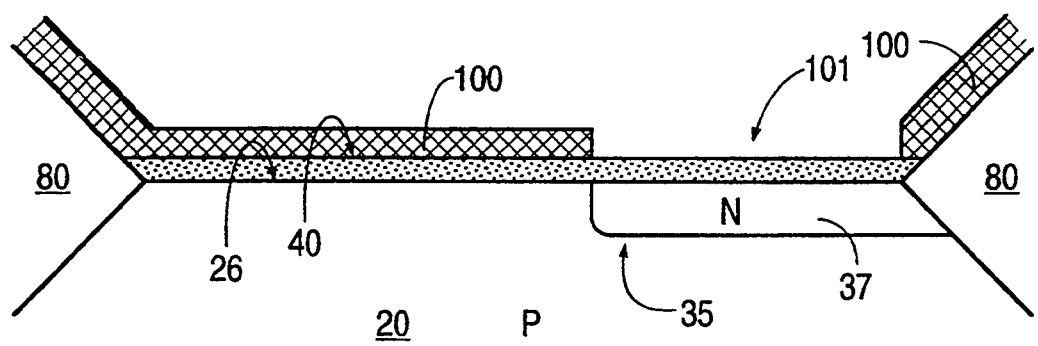

Referring to FIG. 5B, photoresist 100 manufactured by Shipley is then deposited over first dielectric layer 40 and patterned to provide aperture 101. Lightly doped portion 37 of the to be formed drain region 35 is then doped using ion implantation of phosphorus or arsenic to doping concentration of about $10^{18}$ atoms/cm$^3$. The photoresist 100 is then removed using techniques taught by the manufacturer.

Figure 5C:
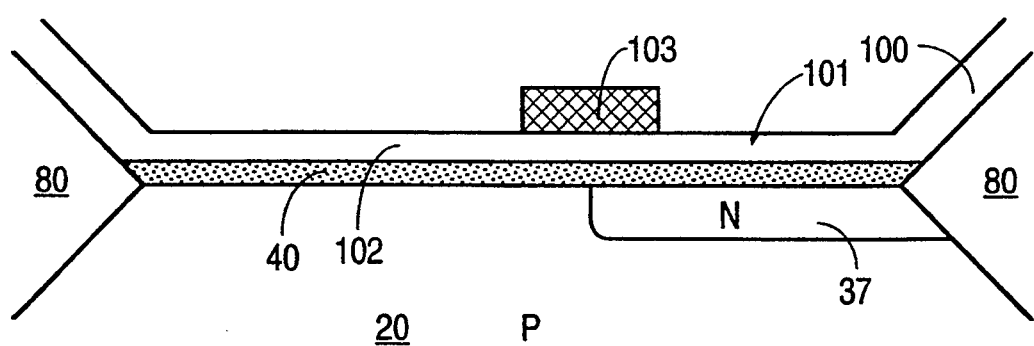

Referring to FIG. 5C, a first polycrystalline silicon layer 102 is formed using standard LPCVD techniques over first dielectric layer 40 to a thickness of about 2500 Å. First polycrystalline silicon layer 102 is then doped with phosphorus or arsenic using well-known ion implantation techniques to a doping concentration of about $10^{19}$ atoms/cm$^3$. Photoresist is then deposited over the first polycrystalline layer 102 and patterned to form photoresist pattern 103. The first polycrystalline layer 102 is then plasma etched using chlorine gas etchant manufactured by Matheson at 45° C. to form floating gate 50. Photoresist pattern 103 is then removed.

Figure 5D:
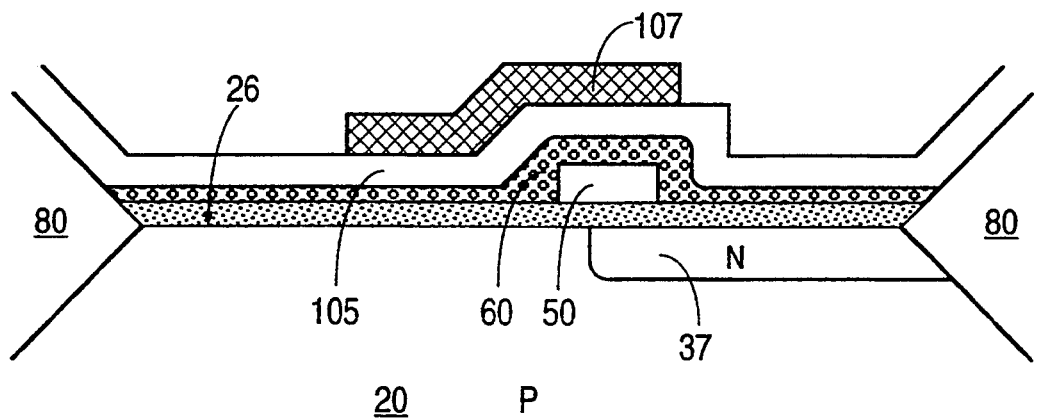

As shown in FIG. 5D, a second dielectric layer 60, typically silicon dioxide, is then formed using chemical vapor deposition or thermal oxidation techniques to a thickness of between 100 to 500 Å, preferably 200 Å.

Second polycrystalline silicon layer 105 is then deposited over second dielectric layer 60 using LPCVD techniques to a thickness of about 3000 Å.

Figure 5E:
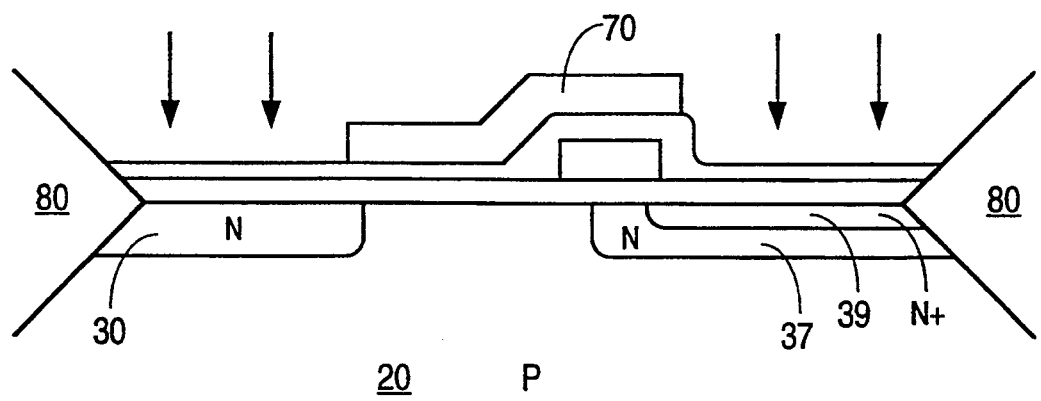

Next, the second polycrystalline silicon layer 105 is then doped with phosphorus or arsenic to provide a resistivity of about 10 $\Omega$-cm. Photoresist 106 is then deposited over second polycrystalline silicon layer 105, and then patterned to provide resist pattern 107. The exposed portion of second polycrystalline silicon layer 105 is then etched to form the desired configuration for control gate 70, as shown in FIG. 5E. Thereafter, photoresist 107 is removed and the heavily doped portion 39 of drain region 35 and the source region 30 are doped using ion implantation with arsenic or phosphorus to a doping concentration of about $10^{20}$ atoms/cm$^3$. Finally, leads are attached by metallization techniques known in the art.

The above described process is the preferred method of producing the inventive memory cell. However, it is of course understood that other known techniques may be substituted to produce the inventive memory cell.

We claim:

1. A method of programming and erasing an electrically programmable, electrically erasable floating gate memory cell having a floating gate electrically insulated from a substrate by means of a first dielectric layer, and a control gate having a portion located over the floating gate and electrically insulated from said floating gate by means of a second dielectric layer, said substrate including a first doped region and a second doped region separated by a channel region, the floating gate being located over the first doped region and a first portion of the channel region, the control gate including a portion located over the second doped region and a second portion of the channel region, the method comprising:

programming said memory cell by applying a first voltage level to said first doped region and a second voltage level to the control gate, said first voltage level being higher than the second voltage level, thereby causing electrons to tunnel through said second dielectric layer from said control gate to said floating gate; and erasing said memory cell by applying the first voltage level to said control gate and the second voltage level to the first doped region, thereby causing electrons to tunnel through said second dielectric layer from said floating gate to said control gate.

2. The method of claim 1 wherein the first doped region includes a lightly-doped portion and a heavily-doped portion, the floating gate being located over the lightly-doped portion of the first doped region;

wherein electrons tunnel at a first rate through said second dielectric layer from said control gate to said floating gate during the programming step; and wherein the step of programming further comprises causing electrons to flow from the floating gate into the lightly-doped portion at a second rate, the first rate being greater than the second rate.

3. The method of claim 2 wherein electrons tunnel at a third rate through said second dielectric layer from said floating gate to said control gate during the erasing step; and wherein the step of erasing further comprises causing electrons to flow from the lightly-doped portion into the floating gate at a fourth rate, the third rate being greater than the fourth rate.

* * * * *